United States Patent [19]

Van Der Meulen et al.

[11] Patent Number: 5,450,010

[45] Date of Patent: Sep. 12, 1995

[54] MAGNETIC RESONANCE IMAGING METHOD AND APPARATUS EMPLOYING EDDY CURRENT COMPENSATION BY MODIFICATION OF GRADIENT SIZE

[75] Inventors: Peter Van Der Meulen; Gerrit H. Van Yperen, both of Eindhoven, Netherlands

[73] Assignee: U.S. Philips Corporation, New York, N.Y.

[21] Appl. No.: 84,833

[22] Filed: Jun. 29, 1993

[30] Foreign Application Priority Data

Jun. 29, 1992 [EP] European Pat. Off. ............ 92201926

[51] Int. Cl.$^6$ ............................................. G01R 33/48
[52] U.S. Cl. ............................................. 324/309
[58] Field of Search ............... 324/309, 307, 300, 314; 128/653.2

[56] References Cited

U.S. PATENT DOCUMENTS

| | | | |
|---|---|---|---|
| 4,647,858 | 3/1987 | Bottomley | 324/320 |
| 4,649,345 | 3/1987 | Yoda et al. | 324/309 |
| 4,684,891 | 8/1987 | Feinberg | 324/309 |
| 4,694,250 | 9/1987 | Iwasaka et al. | 324/309 |
| 4,724,388 | 2/1988 | Sano et al. | 324/309 |
| 4,859,946 | 8/1989 | Kuhara | 324/309 |
| 4,893,081 | 1/1990 | Zur | 324/309 |
| 4,896,112 | 1/1990 | Ratzel et al. | 324/309 |

FOREIGN PATENT DOCUMENTS

0309720 4/1989 European Pat. Off. .

*Primary Examiner*—Sandra L. O'Shea
*Assistant Examiner*—Raymond Y. Mah
*Attorney, Agent, or Firm*—Jack D. Slobod

[57] ABSTRACT

In an MRI device (1) operating according to a spin-echo method, switched gradient magnetic fields are applied in the form of slice selection (231–233), phase encoding (243–243, 243'243') and read gradients (252–253). The switching of the gradients causes eddy currents in metal parts of the apparatus. The eddy currents disturb the applied magnetic fields, thereby changing the phases of the precessing nuclear spins of a body (7) to be examined and causing artefacts in a reconstructed image. Another source of disturbance may be phase-distortion in the RF amplifier. By modifying a gradient (251, 231') in between the excitation pulse (221) and the first refocusing pulse to (222) in the spin-echo sequence and/or a change in phase of the RF-pulses, the effects of the disturbances can largely be compensated for. The additional gradient size is adjusted by measuring the position in time and the relative phase of spin-echo signals (162, 163) in a preparatory sequence (121–173).

19 Claims, 4 Drawing Sheets

MAGNETIC RESONANCE IMAGING METHOD AND APPARATUS EMPLOYING EDDY CURRENT COMPENSATION BY MODIFICATION OF GRADIENT SIZE

BACKGROUND OF THE INVENTION

1. Field of the Invention

The invention relates to a method for magnetic resonance imaging of a body placed in a stationary and substantially homogeneous main magnetic field, the method including at least one measuring sequence including the application of an excitation radio-frequency pulse (RF-pulse) for excitation of nuclear dipole moments in at least a portion of the body, and the application of a plurality of refocusing RF-pulses following said excitation RF-pulse and switched gradient magnetic fields for generating position dependent magnetic resonance signals in the excited portion. Such a sequence of RF-pulses is known as a spin-echo sequence and generates multiple nuclear magnetic resonance echo signals (NMR-signals) following the refocusing RF-pulses. The invention also relates to an apparatus for magnetic resonance imaging using such a method.

2. Description of the Related Art

Such method and apparatus for imaging are known from EP-A 0 309 720. In the known method switched gradient magnetic fields are applied for encoding position information in the NMR-signals. The gradient fields provide slice selection, phase encoding and read gradients. As described in the cited EP-A 0 309 720, switching of the gradients causes eddy currents in the apparatus, which eddy currents generate magnetic fields of their own and disturb the applied magnetic fields, thereby affecting the phases of the precessing nuclear spins of a body to be examined and causing artefacts in a reconstructed image. Such artefacts may exhibit themselves as local low contrast, local absence of signal in an image or the presence of ghosts in the image. In the known method and apparatus the influence of eddy currents in a spin-echo sequence is reduced by changing the main magnetic field by means of energizing an auxiliary coil during a short interval in between the RF-pulses. The strength of the field generated by the auxiliary coils is made proportional to the strength of one of the gradient fields.

A disadvantage of the known method is the necessity to provide the magnetic resonance imaging (MRI) device with auxiliary coils. A further disadvantage is that the modification of the main magnetic field relates to the strength of one gradient field, that it is applied to the whole volume and not adjusted for spatial variations of the effect of the eddy currents.

SUMMARY OF THE INVENTION

It is, inter alia, an object of the invention to provide a magnetic resonance method in accordance to the introductory paragraph in which effects of eddy currents and other disturbances caused by the apparatus, such as phase-distortion in the RF-pulses, are reduced without providing additional coils and in a manner that allows spatial variation of such effects taken into account.

Thereto, the method according to the invention is characterized in that in a measuring sequence the initial stage, till the first refocusing RF-pulse, and the acquisition stage, subsequent to said initial stage, are adjusted relative to each other in dependence of a parameter determined from the magnetic resonance signals measured in a preparatory sequence. The initial stage, or setting up stage, of a sequence is the portion preceding the occurrence and acquisition of the NMR-signals, the latter stage can be referred to as the acquisition stage. An adaption in either stage in a measuring sequence can be done by using the capability of MRI devices generating gradient fields and RF-pulses at almost arbitrary strength and with large flexibility. The invented method uses these built-in features. In the preparatory sequence the effect of the disturbances upon the magnetic resonance signals is determined so that subsequent compensation in the measuring sequence can be achieved. As the disturbing effects, such as eddy currents and distortion in RF-pulse generating means, are constant in the acquisition stage, adjustment is necessary in the initial stage only. However, it is possible to keep the initial stage unchanged but to adjust the acquisition phase with equivalent effect, or to distribute the adjustment in both stages. The preparatory sequence does not need to be identical with a measuring sequence. Differences between the preparatory sequence and a measuring sequence are acceptable if the differences do not give rise to a net contribution of disturbances such as eddy currents and RF-pulse phase distortion.

The method according to the invention is further characterized in that in the initial stage of a measuring sequence a compensation gradient magnetic field is applied with a size adjusted in dependence on the position in time of magnetic resonance signals in the preparatory sequence; and/or in that the acquisition stage is adjusted by adapting the size of the read gradients in dependence of the position in time of magnetic resonance signals in the preparatory sequence. The read gradients provide frequency encoding of the spin-echo signals, and the compensation read gradient introduces a dephasing prior to the first refocusing RF-pulse. The main disturbing effect of, for example, eddy currents is a change of phase of the precessing spins which to a first order is the same in the whole of the selected portion. The adjusted compensation gradient field, or the adjusted read gradients, imposes upon the precessing spins an additional phase difference which is largely equal in magnitude but opposite to the phase difference caused by the disturbances. A consequence of the disturbances is that the realignment of the spins after a refocusing RF-pulse occurs at a different time and in a different direction, as compared to the situation without disturbances. The position in time of spin-echo signals in the preparatory sequence provides a suitable basis for determining the size of the adjustment. As the, already present, gradient coils are used, the MRI device does not need auxiliary coils. By the size of the gradient magnetic field is meant the total strength of the gradient integrated over its duration, i.e. for a rectangular shaped gradient pulse it is the product of strength and length in time. Adjusting the size of the compensation gradient has the advantage that the actual effects of the disturbances upon the nuclear dipole moments in the selected portion of the body are used.

An embodiment of the method according to the invention is characterized in that the preparatory sequence is applied for generating at least a first and a second magnetic resonance signal and in that the accumulated difference between the size of the compensation gradient magnetic field and a read gradient in a measuring sequence and the size of the corresponding compensation gradient magnetic field and the corresponding read gradient in the preparatory sequence is proportional to the deviation of the interval length in between said first and second magnetic resonance signals from the nominal interval length. If the disturbances influence the relative size of the compensation gradient magnetic field and the read gradients, the time difference in the occurrence of the spin-echo signals caused thereby can be measured by determining the length of the interval between different spin-echo signals in the same sequence. As the phase deviation imposed upon the precessing spins is proportional to the size of the magnetic fields, a suitable compensation, to a first order, can be achieved by a compensation gradient that is adjusted in proportion to the detected time difference.

This embodiment is further characterized in that said interval length in between the first and second magnetic resonance signals is determined by means of a fit according to a predetermined function or by means of a cross-correlation algorithm. The spin-echo signals are normally measured in a number of samples, spaced a small interval apart. A satisfactory determination of the relative positions of two spin-echo signals, with an accuracy that is much better than the length of the sampling interval, can be achieved either by a fit using a number of those samples or by applying a correlation analysis using all samples of both measured spin-echo signals or of a large fraction thereof. The correlation method is preferred when the samples in the center of the spin-echo signal provide insufficient variation, for example due to noise, to obtain a fit in which the position of the signal is well-established.

An alternative of the method according to the invention is characterized in that in a measuring sequence the amount of the adjustment of the initial stage relative to the acquisition stage is dependent on the phases of magnetic resonance signals in the preparatory sequence. This measure allows compensation for disturbances that affect the phases of the precessing spins in a portion of the body collectively. Such disturbances are, for example, phase-distortion in the RF-pulse generating chain or deviations in gradient magnetic fields applied for the selection of a slice from the body, deviations that are, for example, due to eddy currents. Simultaneous application of both alternatives is very well possible, providing a measurement sequence which is adjusted in dependence on both NMR-signal position and NMR-signal phase.

This embodiment may be further characterized in that the preparatory sequence is applied for generating at least a first and a second magnetic resonance signal and in that the amount of the adjustment is proportional to the phase difference between said first and second magnetic resonance signals. This allows an accurate compensation if the required correction is linear with the size of the disturbance.

In an embodiment of the method according to the invention, the switched gradient magnetic fields comprise slice selection gradients which are applied simultaneously with the RF-pulses. To realign the spins for the variation of the magnetic field strength across the slice thickness, a rephasing is applied in the interval following the excitation RF-pulse and before the first refocusing RF-pulse. This embodiment is characterized in that the initial stage of a measuring sequence is adjusted by adapting the size of the rephasing slice selection. In this embodiment no additional compensation gradient field is necessary.

An embodiment of the method according to the invention may be further characterized in that a measuring sequence the initial stage is adjusted by adapting the phase of the excitation RF-pulse or by adapting the phases of the refocusing RF-pulses. This provides an alternative to adjustment of the rephasing slice selection gradient. In particular when a selected slice is off-center, it might be simpler to adjust the phase of the excitation RF-pulse, or the refocusing pulses, for that slice than to correct any disturbances in the slice selection gradient field. This embodiment also provides a possibility for correction in case of phase-distortion of the RF-pulses, for example due to imperfection in the RF-pulse generation chain.

An embodiment of the method according to the invention is characterized in that at least two different slices of the body are selected and in that the initial stage or the acquisition stage of the measuring sequences are adjusted for each selected slice separately. In this embodiment several slices are imaged, and the compensation is optimized for each of the slices individually. This takes into account that disturbances may have different effects at different positions of the body.

The invention also relates to an apparatus for performing such a method. An apparatus according to the invention for magnetic resonance imaging of a body placed in a stationary and substantially homogeneous main magnetic field according to the invention, the apparatus comprising means for establishing the main magnetic field, means for generating gradient magnetic fields superimposed upon the main magnetic field, means for radiating RF-pulses towards a body placed in the main magnetic field, control means for steering the generation of the gradient magnetic fields and the RF-pulses, and means for receiving and sampling magnetic resonance signals generated by sequences of RF-pulses and switched gradient magnetic fields, said control means being arranged for applying an excitation RF-pulse for excitation of nuclear dipole moments in at least a portion of the body, and for applying a plurality of refocusing RF-pulses following said excitation RF-pulse and switched gradient magnetic fields for generating position dependent magnetic resonance signals in the excited portion, The apparatus is characterized, in accordance with the invention, in that said control means are further arranged for applying a preparatory sequence comprising an excitation RF-pulse, refocusing RF-pulses and switched gradient magnetic fields and for measuring magnetic resonance signals generated in the preparatory sequence, and for in a measuring sequence adjusting the initial stage, till the first refocusing RF-pulse, and the acquisition stage, subsequent to said initial stage, relative to each other in dependence on a parameter determined from the magnetic resonance signals measured in the preparatory sequence.

These, and other more detailed aspects of the invention will now be elucidated by way of example with reference to the accompanying drawings.

DETAILED DESCRIPTION OF THE PREFERRED EMBODIMENTS

Figure 1:
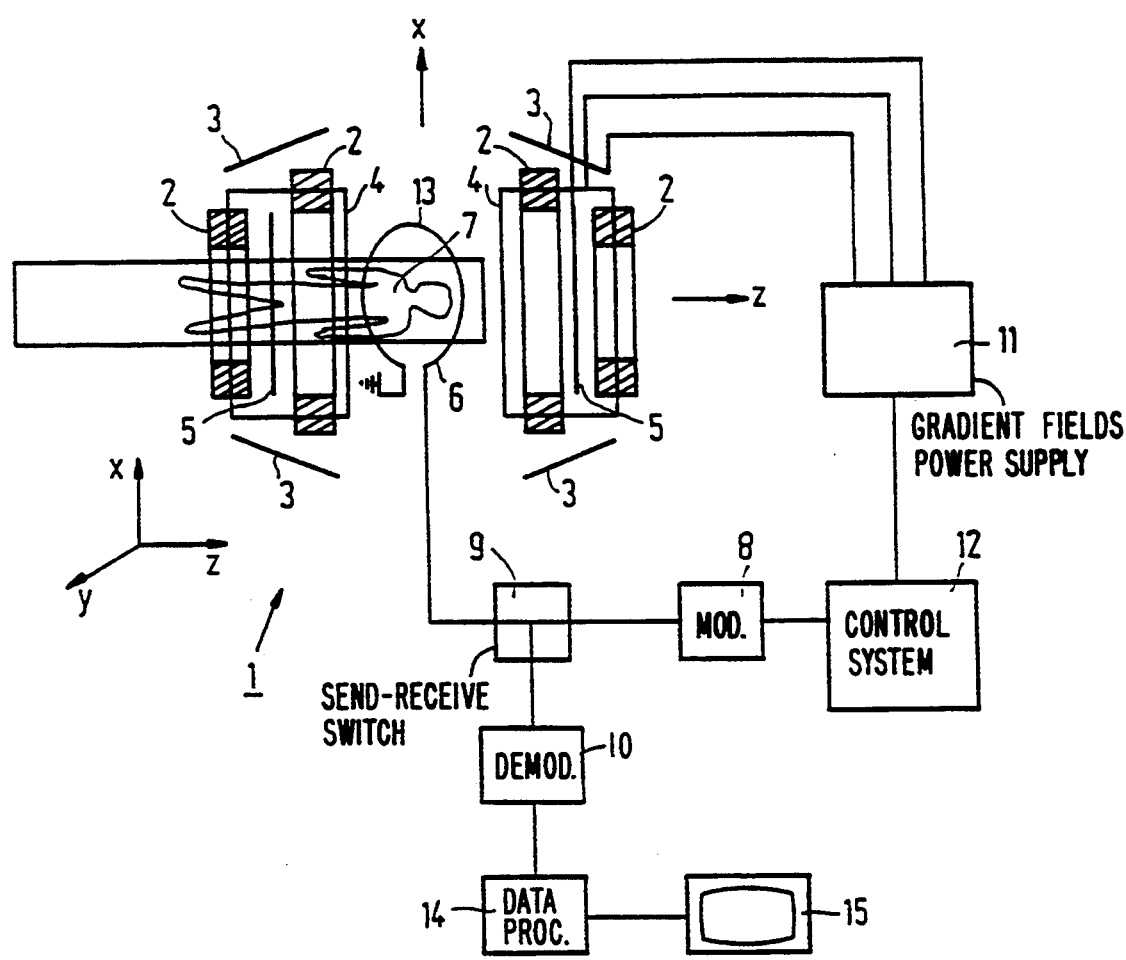
FIG. 1 shows diagrammatically a magnetic resonance imaging apparatus, suitable for the method according to the invention.

In FIG. 1 a magnetic resonance apparatus 1 is diagrammatically shown. The apparatus comprises a set of main magnetic coils 2 for generating a stationary homogeneous main magnetic field and several sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energized via a power supply 11. The apparatus further comprises emitting means 6 for emitting radio-frequency pulses (RF-pulses) to an object or body 7, the radiation means being coupled to modulating means 8 for generating and modulating of the RF-pulses. Also provided are means for receiving the NMR-signals, these means can be identical to the emitting means 6 or be separate. If the emitting and receiving means are identical, as shown in the Figure, a send-receive switch 9 is arranged to separate the received signals from the pulses to be emitted. The received NMR-signals are input to receiving and demodulating means 10. The emitting means 6 and 8 and the power supply 11 for the gradient coils 3, 4 and 5 are steered by a control system 12 to generate a predetermined sequence of RF-pulses and gradient field pulses. The demodulation means is coupled to a data processing unit 14, for example a computer, for transformation of the received signals into an image that can be made visible, for example on a visual display unit 15.

If the magnetic resonance apparatus 1 is put into operation with an object or body 7 placed in the magnetic field, a small excess of nuclear dipole moments (nuclear spins) in the body will be aligned in the direction of the magnetic field. In equilibrium, this causes a net magnetization $M_0$ in the material of the body 7, directed in parallel with the magnetic field. In the apparatus 1 the macroscopic magnetization $M_0$ is manipulated by radiating to the body RF-pulses having a frequency equal to the Larmor frequency of the nuclei, thereby bringing the nuclear dipole moments in an excited state and re-orienting the magnetization $M_0$. By applying the proper RF-pulses, a rotation of the macroscopic magnetization is obtained, the angle of rotation is called the flip-angle. The intentional introduction of variations in the magnetic field by applying gradient magnetic fields influences the behavior of the magnetization locally. After the application of RF-pulses, the changed magnetization will strive to return to a state of thermal equilibrium in the magnetic field, emitting radiation in the process. A well chosen sequence of RF-pulses and gradient field pulses causes this radiation to be emitted as NMR-signals which provide information about the density of a certain type of nuclei, for example hydrogen nuclei, and the substance in which they occur. By analysis of the emitted signals and presentation of it in the form of images, information about the internal structure of the object or body 7 is accessible. For a more detailed descriptions of magnetic resonance imaging (MRI) and MRI-devices reference is made to the extensive literature on this subject, for example to the book "Practical NMR Imaging", edited by M. A. Foster and J. M. S. Hutchinson, 1987, IRL Press.

Figure 2:
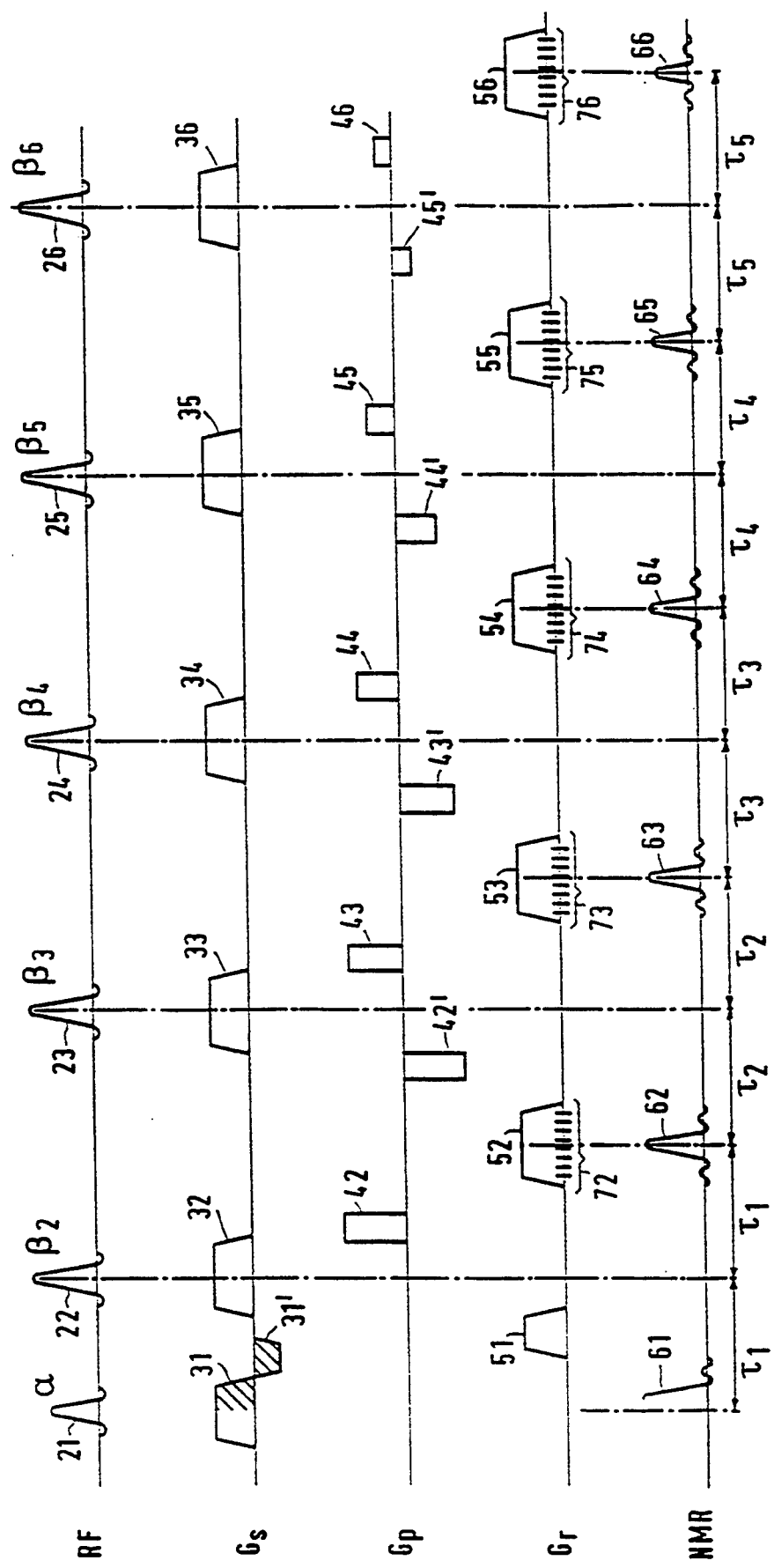
FIG. 2 shows a sequence comprising aligned timing diagrams of RF-pulses, three gradient magnetic fields and spin-echo signals.

FIG. 2 shows a sequence of RF-pulses and magnetic field gradients for obtaining multiple spin-echo NMR-signals following a single excitation pulse. In the upper line RF the start of the sequence is indicated with an excitation RF-pulse 21 having a flip-angle $\alpha$, followed after an interval $\tau_1$ by a first refocusing RF-pulse 22 having a flip-angle $\beta_2$. Normally, the values of $\alpha$ and $\beta_2$ are 90° and 180°, respectively. Following the excitation RF-pulse 21, a free induction decay (FID) nuclear magnetic resonance signal 61, indicated on the lower line NMR, is generated which vanishes rapidly when the individual precessing nuclear magnetic dipole moments lose phase coherence due to local variations in the magnetic field. The refocusing RF-pulse 22 reverses the direction of these individual magnetic dipole moments without affecting the local magnetic field. Consequently, the dephasing is reversed into a rephasing resulting after an equal interval $\tau_1$ in the occurrence of a NMR spin-echo signal 62. After the spin-echo signal 62 the dipole moments dephase again. Repetition of refocusing RF-pulses 23, 24, 25 and 26, with flip-angles $\beta_i$, $i=3, \ldots, 6$, normally also of 180°, cause subsequent reversals of the alephasing and the repeated occurrence of NMR spin-echo signals 63, 64, 65 and 66. The interval lengths $\tau_2, \tau_3, \tau_4$ and $\tau_5$ between a spin-echo signal and the next refocusing RF-pulse are normally chosen to be equal in length.

The effect of the RF-pulses is made selective to a portion of the body 7 by applying, for example, simultaneously with the RF-pulses a slice selection gradient, which is indicated on the second line $G_s$ in the FIG. 2. As indicated by 31 the slice selection gradient is first applied during the excitation RF-pulse 21. The dephasing caused by this first gradient 31 is compensated by an opposite gradient 31'. Also during the application of the refocusing RF-pulses 22-26 slice selection gradients 32-36 are switched on. For position determination within the selected slice, phase encoding gradient pulses 42, 43, 44, 45 and 46 with the gradient direction within the selected slice, indicated on the third line $G_p$, are applied in the interval between the RF-pulse and the NMR spin-echo signals 62, 63, 64, 65 and 66. In addition, frequency encoding or read gradients 52, 53, 54, 55 and 56, indicated on the fourth line $G_r$, having a gradient direction also within the selected slice but perpendicular to the gradient direction of the phase encoding field, are switched on during the occurrence of the spinecho signals. The dephasing effects of the phase encoding gradients is removed after the occurrence of the spin-echo signals by applying further gradient pulses 42', 43', 44', 45' with the same size but with the gradient direction opposite compared to the preceding gradient pulses 42, 43, 44, 45, respectively. The dephasing effect of the read gradients 52, 53, 54, 55 and 56 is compensated for by the refocusing RF-pulses. A compensation read gradient 51, applied in the interval in between the excitation RF-pulse 21 and the first refocusing RF-pulse 22, provides initial dephasing of the spins in the read direction. This compensation read gradient 51 has half the size of the read gradients 52, 53, 54, 55 and 56.

During the occurrence of a spin-echo signal, the signal is sampled a number of times, 256 is a usual number, as indicated by the sampling arrays 72, 73, 74, 75 and 76 in FIG. 2. By means of quadrature detection, each of the samples provides an in-phase and a 90°-phase shifted signal or, alternatively phrased, each sample yields the real and imaginary components of a complex NMR-signal value.

As mentioned hereinbefore, in the absence of any disturbing effects, the position in time of the maximum of the first spin-echo signal will occur at an interval $\tau_1$ after the first refocusing RF-pulse 22, equal to the interval between the excitation RF-pulse 21 and the first refocusing RF-pulse. However, if additional and disturbing gradient magnetic fields are present, for example caused by eddy currents, deviation between the nominal gradient sizes occur. For example, the total size of the gradient in the read direction $G_r$ in between the excitation RF-pulse 21 and the first refocusing RF-pulse 22 is not equal to the size of the read gradient 52 between the refocusing RF-pulse 22 and the end of the time $\tau_1$ thereafter. This results in a shift of the position of the first spin-echo signal 62.

The shift in position of a spin echo signal can be determined by measuring its position and comparing it with the nominal time $\tau_1$. In this way the eddy currents effects of the rising and falling edges of the compensation read gradient 51 and of the rising edge of the read gradient 52 are taken into account. However, further eddy currents are associated with the failing edges of the read gradient 52, 53 . . . , which influence the next spin-echo signals. Theretofore, it is preferred to measure the length of the interval between the first two spin-echo signals 62 and 63 and compare this with the interval $2\tau_2$ to obtain a more complete determination of the disturbance and a better compensation.

Figures 3A, 3B:
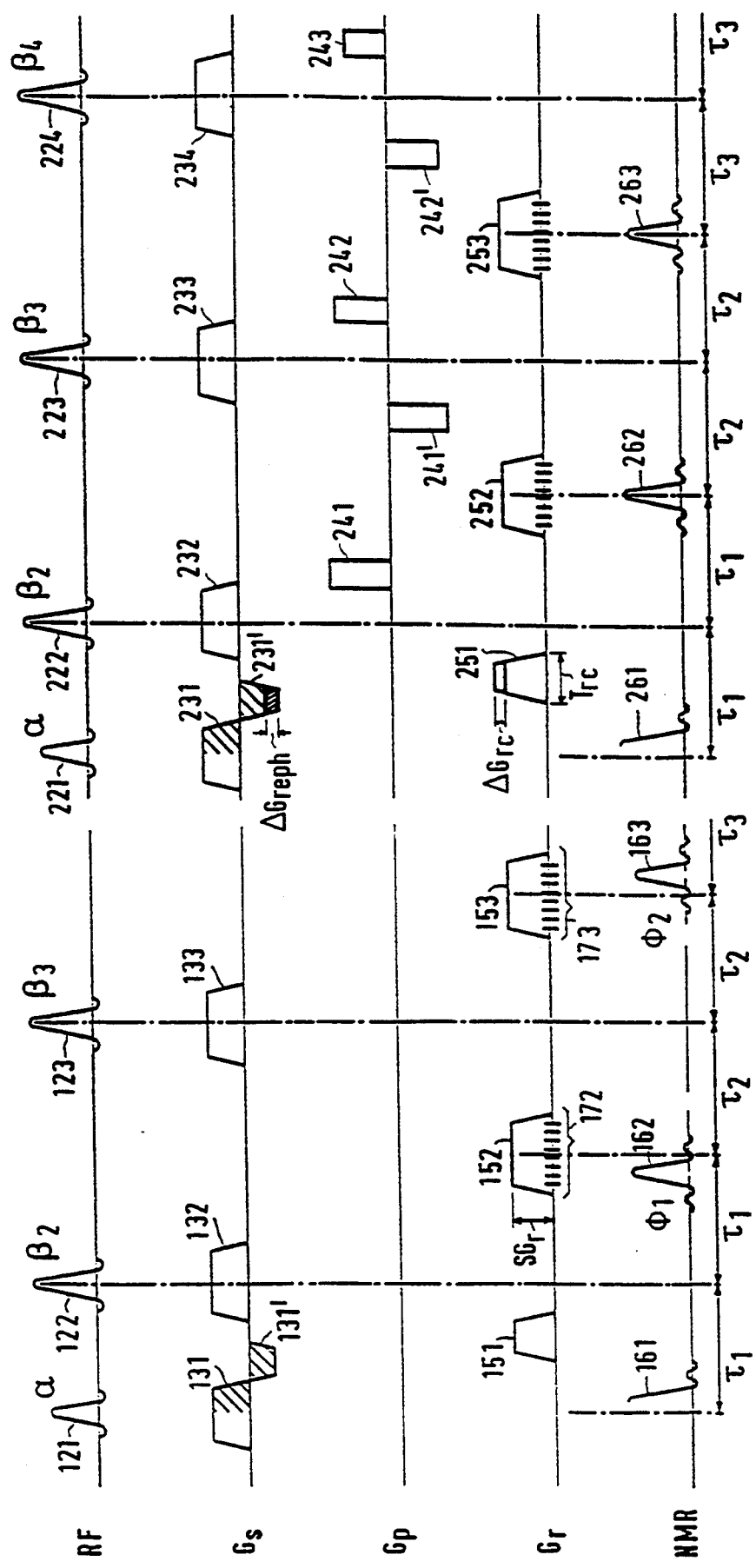
FIGS. 3a and 3b show a preparatory sequence and a measuring sequence, respectively, both comprising aligned timing diagrams of RF-pulses, three gradient magnetic fields and spin-echo signals according to a first embodiment of the invention.

This is illustrated in FIG. 3a, in which a preparatory sequence is shown, being largely identical to the first portion of the sequence shown in FIG. 2, till the occurrence of the second NMR-signal 63. The positions of the NMR-signals 162 and 163 is clearly shifted. Apart from its length, the difference between the preparatory sequence and a measuring sequence is the absence of the phase encoding gradient pulses $G_p$. This difference is of negligible influence as the phase encoding gradients have no net contribution in between RF-pulses, and any disturbances are largely compensated for by the gradient pulse with opposite sign. For determining the position of the spin-echo signals, the amplitudes, i.e. the modulus of the complex sample values, of a number of the samples 172 and 173 around the nominal position of the signals are fitted with a curve, for example a parabola. The positions $p_1$ and $p_2$, expressed in sample number, of the maximum of the spin-echo signal can then be obtained with an accuracy that is a traction of the interval dt between two samples.

These positions are used to adjust the size of the compensation read gradient 251 preceding the first refocusing RF-pulse 222 in the measuring sequence(s), of which a portion is shown in FIG. 3b. Subsequent to the portion illustrated a further sequence of refocusing RF-pulses, gradient pulses and spin-echo signals completes a full measurement sequence. The sequence partly shown in FIG. 3b is identical with the one shown in FIG. 2, with the exception of the size of the compensation read gradient 251, a detailed description of the identical elements in the Figure will not be given. The size of the compensation read gradient 251 is adjusted by changing its strength with an amount $\Delta G_{rc} = \frac{1}{2}(p_1-p_2) \cdot SG_r \cdot dt/T_{rc}$, in which $\Delta G_{rc}$ is the change in strength, $T_{rc}$ the length of the compensation read gradient, $SG_r$ the strength of the read gradient, $p_1-p_2$ the difference in interval length between the NMR-signals expressed in sample number for each of the signals and dt the length of the sampling interval. As the relevant parameter is not the strength but the time-integrated value of the compensation read gradient, any change in size equivalent to the given amount can be chosen within the framework of the present invention, for example the length of the compensation read gradient can be changed with an amount $\Delta T_{rc} = \frac{1}{2}(p_1-p_2) \cdot dt \cdot SG_r/G_{rc}$. After modification of the size of the compensation read gradient 251 in the measuring sequence, the mismatch between the sizes of the read gradient pulses is corrected and the NMR-signals 262, 263, etc., will appear at the expected positions in time.

An alternative to the curve fit for determining the length of the interval between the two spin-echo signals is calculating the correlation between the two sets of samples of the two measured spin-echo signals as a function of a supposed interval-length between them. By varying the supposed interval length, the correlation function will have its maximum when the two sets have maximum overlap, the corresponding interval-length is the distance between the two pulses. This method has the advantage that all samples, or a large fraction of them, contribute to the position determination. This is advantageous if the center samples alone are insufficient for providing reliable information, for example due to noise.

In the preparatory sequence, care has to be taken to avoid negative effects caused by the interference of the desired spin-echo signals with unwanted stimulated echoes. This can be done, for example, by dephasing in the selection direction or intentionally applying a deviation from the indicated timing, thereby deviating from the condition that the size of the nominal gradients in between the excitation and first refocusing RF-pulses is equal to one-half of the size between the refocusing RF-pulses. In the latter case, the stimulated echo and the desired spin-echo signal are not coincident.

Similar to the described influence of eddy currents in the read direction, eddy currents, or other disturbances, also act upon the signal in the slice selection direction. The effect in this direction exhibits itself in the phase of the NMR-signals. As indicated in FIG. 3b, the disturbance can be compensated in a measuring sequence by an additional gradient pulse in between the excitation RF-pulse 221 and the first refocusing RF-pulse 222. In between those RF-pulses there is already a slice selection gradient rephasing pulse 231' and the additional pulse can be applied by adjusting the size of this rephasing pulse 231' by an amount $\Delta G_{reph}$. The amount $\Delta G_{reph}$ is proportional to the difference $o_2-o_1$ of the phases $o_1$ and $o_2$ at the center of the NMR-signals 162 and 163 in the preparatory sequence. Correction for a possible position shift in the read direction may be necessary in case of off-center detection in the read gradient direction. The correction $\Delta G_{reph}$ is given by $\Delta G_{reph} = \frac{1}{2}(o_1-o_2)/T_{reph} \cdot 2\pi \gamma z_{off}$, in which $\Delta G_{reph}$ is the change in strength of the rephasing pulse 231', $T_{reph}$ its length, $o_1-o_2$ the phase difference, $\gamma$ the gyromagnetic ratio of the excited nuclear spins and $z_{off}$ the off-center position of the selected slice in the direction perpendicular to the slice. Also the length of the rephasing pulse 231' can be changed for achieving the same effect.

Alternative to an adjustment of the slice selection rephasing pulse 231', the same compensating effect can be achieved by adjusting the phase of the excitation RF-pulse 221 in the measuring sequence by an amount $\Delta o_\alpha = -\frac{1}{2}(o_2 - o_1)$. This adjustment of the RF-pulse phase is preferred if a body is imaged by means of two-dimensional images of a plurality of slices. In that case, the variation of the phase across the thickness of the slice is of less importance. Two possible causes of disturbance, phase-distortion in the RF-chain and deviations of the slice selection gradients can be disentangled by measurements having different off-center positions.

If several slices in the body are measured simultaneously, for example, by generating spin-echo sequences which alternate the frequency of the RF-pulses and/or the value of the selection gradient $G_s$, the method described hereinbefore, allows the determination of the optimum compensation for each of the slices separately. The given procedure of determining the adjustment value by means of a short preparatory sequence is then repeated for each of the selected slices.

Alternatively to one or more two dimensional measurements in selected slices, a portion of the body can be imaged in three dimensions. In that case the slice selection gradient $G_s$ may be adopted for selection of a thick section of the body or even be absent. In addition to the mentioned gradient magnetic field $G_p$, is applied having a gradient direction perpendicular to the gradient directions of the first phase encoding field $G_p$ and the read gradient field $G_r$. This is illustrated in 4, in which Figure a slice selection gradient $G_s$ is supplemented by a second series of phase encoding gradients $G_p'$. As the illustrated sequence, in its other aspects, is identical to the sequence shown in FIG. 2, no detailed discussion is given. Like the first phase encoding field $G_p$, the second gradient encoding field is applied as a series of gradient pulses 382, 383, 384, 385, 386, following the RF-pulses and compensating gradient pulses 382', 383', 384', 385', following the spin-echo signals. The way in which the sizes of first and second phase encoding gradient pulses vary can be chosen at will, provided all required combinations of phase encoding gradients in the two directions are present.

Figure 4:
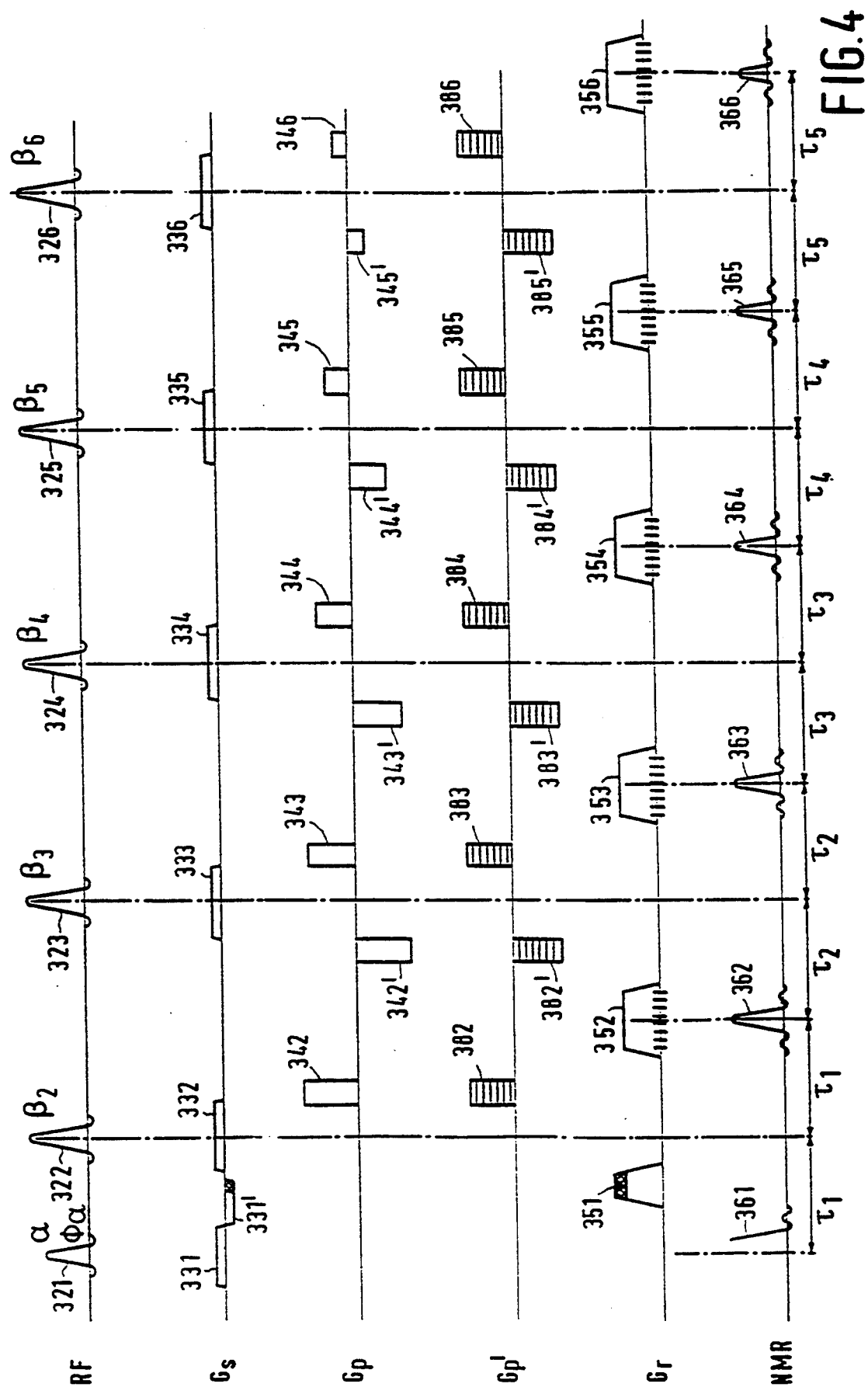
FIG. 4 shows a measuring sequence comprising aligned timing diagrams illustrating the adjusted gradient fields in the initial stage in a three-dimensional imaging method.

In a manner, analogous as described in the two-dimensional case with reference to the FIGS. 3a and 3b, the difference in position and phase of spin-echo signals in a preparatory sequence, not shown, is to be determined. As shown by the cross-hatched area in FIG. 4, in the three-dimensional case the compensation gradient magnetic fields are applied as an adjustment of the strength of the compensation read gradient 351 and as an adjustment of the rephasing slice selection gradient 331'. The phase of the excitation RF-pulse 321 can be adjusted to tune the phase of the NMR-signals in the center of the area to be imaged, independent of the influence of disturbing magnetic fields.

We claim:

1. Method for magnetic resonance imaging of a body placed in a stationary and substantially homogeneous main magnetic field, the method including at least one measuring sequence comprising application of an excitation RF-pulse for excitation of nuclear dipole moments in at least a portion of the body, and application of a plurality of refocusing RF-pulses following said excitation RF-pulse and switched gradient magnetic fields for generating position dependent magnetic resonance signals in the excited portion, and a preparatory sequence comprising application of an excitation RF-pulse and application of refocusing RF-pulses and switched gradient magnetic fields, and measurement of magnetic resonance signals generated in the preparatory sequence wherein the measuring sequence has an initial stage, till a first of the refocusing RF-pulses in the measuring sequence, and an acquisition stage, subsequent to said initial stage, at least one of which stages is adjusted in dependence on a determination made from the measurement of the magnetic resonance signals generated in the preparatory sequence.

2. Method according to claim 1, wherein said switched gradient magnetic fields in said measuring sequence and in said preparatory sequence comprise read gradients applied during the occurrence of the magnetic resonance signals generated in the respective sequence, wherein the determination made from the magnetic resonance signals measured in the preparatory sequence is the position in time of the magnetic resonance signals generated in the preparatory sequence, and wherein said at least one of the stages of the measuring sequence is adjusted either by applying a compensation gradient magnetic field in the initial stage with a size adjusted in dependence on the determined position in time, or by adapting the size of the read gradients in the acquisition stage in dependence on the determined position in time.

3. Method according to claim 2, wherein the magnetic resonance signals generated in the preparatory sequence include at least first and second spaced apart magnetic resonance signals and the determined position in time is an interval length between said first and second magnetic resonance signals which is subject to deviation from a nominal interval length and an accumulated difference between the size of the compensation gradient magnetic field and the read gradient in the measuring sequence and the size of a corresponding compensation gradient magnetic field and a corresponding read gradient in the preparatory sequence is proportional to the deviation of the determined interval length between said first and second magnetic resonance signals from the nominal interval length.

4. Method according to claim 3, wherein said interval length between the first and second magnetic resonance signals is determined by means of a fit according to a predetermined function or by means of a cross-correlation algorithm.

5. Method according to claim 1, an amount of adjustment of at least one of the initial stage and the acquisition is dependent on a determination of phase of the magnetic resonance signals generated in the preparatory sequence.

6. Method according to claim 5, wherein the magnetic resonance signals generated in the preparatory sequence include at least first and a second spaced apart magnetic resonance and the amount of the adjustment is proportional to a difference in phase between said first and second magnetic resonance signals.

7. Method according to claim 5, wherein said switched gradient magnetic fields in said measuring sequence comprise slice selection gradients applied simultaneously with RF-pulses and a rephasing slice selection gradient applied in an interval between the application of the excitation RF-pulses and the application of the first of said refocusing RF-pulses, characterized in that the initial stage of the measuring sequence is adjusted by adapting the size of the rephasing slice selection gradient.

8. Method according to claim 5, wherein the initial stage of the measuring sequence is adjusted either by adapting the phase of the excitation RF-pulse or by adapting the phases of the refocusing RF-pulses.

9. Method according to claim 1, wherein a plurality of sequences comprising RF-pulses and switched gradient magnetic fields are applied, and wherein at least two different slices of the body are selected and the initial stage or the acquisition stage of the measuring sequences are adjusted for each selected slice separately.

10. Apparatus for magnetic resonance imaging of a body under examination, the apparatus comprising means for establishing a stationary and Substantially homogeneous main magnetic field in a measurement space adapted to receive at least part of the body, means for generating gradient magnetic fields superimposed upon the main magnetic field, means for radiating RF-pulses into the measurement space, control means for steering, in sequences, the generation of the gradient magnetic fields and the RF-pulses by said generating and radiation means, and means for receiving and sampling magnetic resonance signals generated in the body under examination by sequences of RF-pulses and switched gradient magnetic fields, said control means being arranged for steering said generating and radiation means for applying a measuring sequence comprising an excitation RF-pulse for excitation of nuclear dipole moments in at least a portion of the received part of the body under examination, and a plurality of refocusing RF-pulses following said excitation RF-pulse and switched gradient magnetic fields for generating position dependent magnetic resonance signals in the excited portion, said measuring sequence comprising an initial stage till a first of said plurality of refocusing RF-pulses and an acquisition stage subsequent to said initial stage, said control means being further arranged for steering said generating and radiating means for applying a preparatory sequence comprising an excitation RF-pulse, refocusing RF-pulses and switched gradient magnetic fields and for measuring magnetic resonance signals generated in the preparatory sequence, and for in a measuring sequence adjusting at least one of the initial stage and the acquisition stage in dependence on a determination from the measurement of the magnetic resonance signals generated in the preparatory sequence.

11. Method according to claim 2, an amount of adjustment of at least one of the initial stage and the acquisition is dependent on a determination of phase of the magnetic resonance signals generated in the preparatory sequence.

12. Method according to claim 3, an amount of adjustment of at least one of the initial stage and the acquisition is dependent on a determination of phase of the magnetic resonance signals generated in the preparatory sequence.

13. Method according to claim 4, an amount of adjustment of at least one of the initial stage and the acquisition is dependent on a determination of phase of the magnetic resonance signals generated in the preparatory sequence.

14. Method according to claim 11, wherein the magnetic resonance signals generated in the preparatory sequence include at least first and a second spaced apart magnetic resonance signals and the amount of the adjustment is proportional to a difference in phase between said first and second magnetic resonance signals.

15. Method according to claim 12, wherein the magnetic resonance signals generated in the preparatory sequence include at least first and a second spaced apart magnetic resonance signals and the amount of the adjustment is proportional to a difference in phase between said first and second magnetic resonance signals.

16. Method according to claim 13, wherein the magnetic resonance signals generated in the preparatory sequence include at least first and a second spaced apart magnetic resonance signals and the amount of the adjustment is proportional to a difference in phase between said first and second magnetic resonance signals.

17. Method according to claim 11, wherein said switched gradient magnetic fields in said measuring sequence comprise slice selection gradients applied simultaneously with RF-pulses and a rephasing slice selection gradient applied in an interval between the application of the excitation RF-pulses and the application of the first of said refocusing RF-pulses, characterized in that the initial stage of the measuring sequence is adjusted by adapting the size of the rephasing slice selection gradient.

18. Method according to claim 12, wherein said switched gradient magnetic fields in said measuring sequence comprise slice selection gradients applied simultaneously with RF-pulses and a rephasing slice selection gradient applied in an interval between the application of the excitation RF-pulses and the application of the first of said refocusing RF-pulses, characterized in that the initial stage of the measuring sequence is adjusted by adapting the size of the rephasing slice selection.

19. Method according to claim 13, wherein said switched gradient magnetic fields in said measuring sequence comprise slice selection gradients applied simultaneously with RF-pulses and a rephasing slice selection gradient applied in an interval between the application of the excitation RF-pulses and the application of the first of said refocusing RF-pulses, characterized in that the initial stage of the measuring sequence is adjusted by adapting the size of the rephasing slice selection gradient.

* * * * *